US012587169B2

(12) United States Patent
Tamaoki

(10) Patent No.: US 12,587,169 B2
(45) Date of Patent: Mar. 24, 2026

(54) ACOUSTIC WAVE FILTER

(71) Applicant: Murata Manufacturing Co., Ltd.,
Nagaokakyo (JP)

(72) Inventor: Norikazu Tamaoki, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 137 days.

(21) Appl. No.: 18/391,745

(22) Filed: Dec. 21, 2023

(65) Prior Publication Data

US 2024/0235527 A1      Jul. 11, 2024

(30) Foreign Application Priority Data

Jan. 5, 2023      (JP) ................................. 2023-000713

(51) Int. Cl.
*H03H 9/64*          (2006.01)
*H03H 9/02*          (2006.01)
(52) U.S. Cl.
CPC ...... *H03H 9/6489* (2013.01); *H03H 9/02992*
(2013.01); *H03H 9/6483* (2013.01)
(58) Field of Classification Search
CPC ............. H03H 9/6489; H03H 9/02992; H03H
9/6483; H03H 9/725
USPC .......................................... 333/133, 193–196
See application file for complete search history.

(56) References Cited

U.S. PATENT DOCUMENTS

| | | | |
|---|---|---|---|
| 2013/0113576 A1 | 5/2013 | Inoue et al. | |
| 2016/0285431 A1* | 9/2016 | Nakahashi | .......... H03H 9/0009 |
| 2023/0402992 A1* | 12/2023 | Noguchi | ............ H03H 9/14541 |

FOREIGN PATENT DOCUMENTS

JP          2016-220263 A      12/2016

* cited by examiner

*Primary Examiner* — Jorge L Salazar, Jr.
(74) *Attorney, Agent, or Firm* — Keating & Bennett, LLP

(57)          ABSTRACT

An acoustic wave filter 1 includes a filter circuit 10 and an
additional circuit 20. The additional circuit 20 includes a
plurality of IDTs 31, 32 and a reflector 41. A first excitation
portion 51x of the IDT 31 is placed adjacent to the reflector
41 and, among a plurality of electrode fingers 35 included in
the outermost IDT 31, includes electrode fingers numbered
in ((N/2)+1) on condition that a total number N of the
electrode fingers included in the pertinent IDT is an even
number or includes electrode fingers numbered in ((N+1)/2)
on condition that the total number N is an odd number. A
second excitation portion 51y of the IDT 31 includes two or
more electrode fingers, except the electrode fingers of the
first excitation portion 51x. Provided an average arrange-
ment pitch of the electrode fingers included in the first
excitation portion 51x is defined as px and provided an
average arrangement pitch of a plurality of reflection elec-
trode fingers 45 is defined as pr, pr/px has a value in a range
from 0.5 to 0.97 inclusive or a range from 1.15 to 2.0
inclusive.

20 Claims, 6 Drawing Sheets

$p_x = D_x/$(NUMBER Nx OF ELECTRODE FINGERS IN FIRST EXCITATION PORTION 51x − 1)

$p_y = D_y/$(NUMBER Ny OF ELECTRODE FINGERS IN SECOND EXCITATION PORTION 51y - 1)

$p_r = D_r/$(NUMBER Nr OF REFLECTION ELECTRODE FINGERS IN REFLECTOR 41 - 1)

ACOUSTIC WAVE FILTER

BACKGROUND OF THE INVENTION

1. Field of the Invention

The present invention relates to an acoustic wave filter.

2. Description of the Related Art

Conventionally, an acoustic wave filter including a filter circuit and an additional circuit connected in parallel to the filter circuit has been known. In Japanese Unexamined Patent Application Publication No. 2016-220263, there is disclosed a branching filter including a transmission filter connected between an antenna terminal and a transmission terminal, a reception filter connected between the antenna terminal and a reception terminal, and an acoustic wave element having one end connected to a path between the antenna terminal and the transmission terminal and having the other end connected to a path between the antenna terminal and the reception terminal. The acoustic wave element is an element to convert a phase of a transmission signal, inputted into the transmission terminal, into an opposite phase and is provided with a reflector.

SUMMARY OF THE INVENTION

Improvement in Q-value can be achieved by provision of the reflector for the acoustic wave element, for instance, whereas increase in Q-value may cause unnecessary resonance of the acoustic wave element and occurrence of excitation waves in a band out of a pass band of the acoustic wave filter. A problem is caused in this case in that it is impossible to ensure attenuation characteristics in the band out of the pass band.

The present invention has been produced in order to solve the problem and it is an object thereof to provide an acoustic wave filter by which the occurrence of excitation waves in a band out of the pass band can be curbed.

In order to achieve the object described above, an acoustic wave filter according to an aspect of the present invention includes: a plurality of input-output terminals; a filter circuit provided in a first path linking the plurality of input-output terminals; and an additional circuit provided in a second path connected in parallel to at least a portion of the first path. The additional circuit includes a resonator including a plurality of interdigital transducers (IDTs) and a reflector. The plurality of IDTs are placed along a first direction. The IDTs each include a plurality of electrode fingers extending in a second direction intersecting with the first direction and arranged along the first direction. The reflector is placed adjacent to an outermost IDT that is located in an outermost side portion of the plurality of IDTs with respect to the first direction and includes a plurality of reflection electrode fingers extending in the second direction and arranged along the first direction. The outermost IDT includes a first excitation portion and a second excitation portion. The first excitation portion is placed adjacent to the reflector in the first direction and, provided a total number of the plurality of electrode fingers included in the outermost IDT is defined as N, has the electrode fingers numbered in $((N/2)+1)$ on condition that N is an even number or the electrode fingers numbered in $((N+1)/2)$ on condition that N is an odd number, among the electrode fingers included in the pertinent IDT. The second excitation portion is placed on an opposite side to the reflector as seen from the first excitation portion in the first direction and includes two or more electrode fingers, except the electrode fingers of the first excitation portion, among the plurality of electrode fingers included in the outermost IDT. Provided an average arrangement pitch of the electrode fingers included in the first excitation portion in the first direction is defined as px and provided an average arrangement pitch of the plurality of reflection electrode fingers in the first direction is defined as pr, pr/px has a value in a range from 0.5 to 0.97 inclusive or a range from 1.15 to 2.0 inclusive.

According to the acoustic wave filter of the present invention, occurrence of excitation waves in a band out of a pass band can be curbed.

DESCRIPTION OF THE PREFERRED EMBODIMENTS

Figure 1:
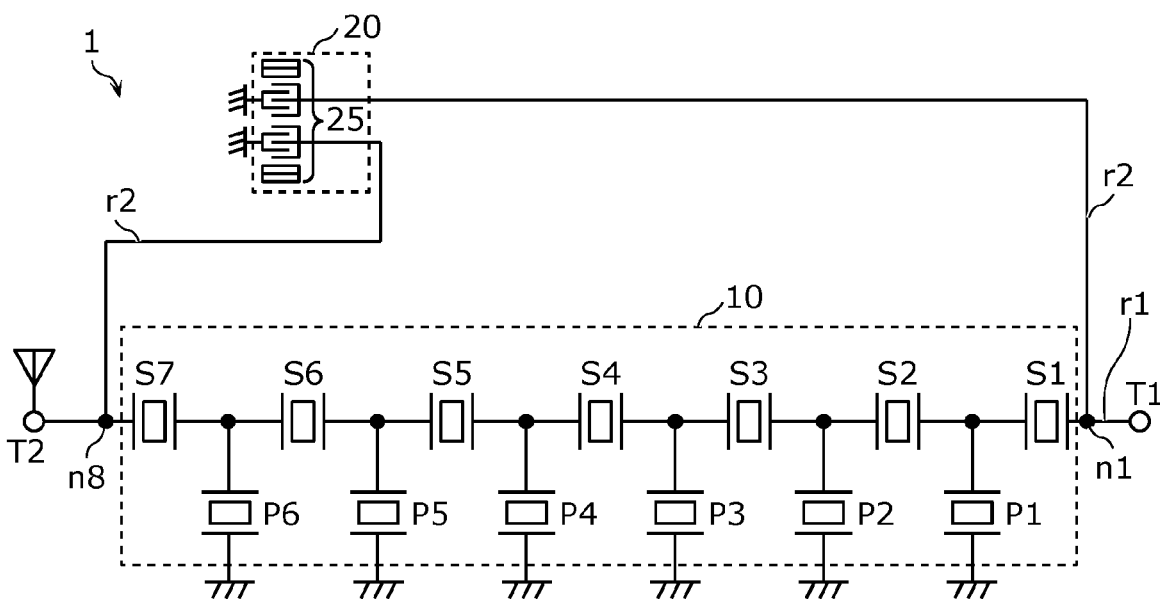
FIG. 1 is a diagram illustrating an acoustic wave filter according to an embodiment and circuit configurations of a filter circuit and an additional circuit that are included in the acoustic wave filter.

Hereinbelow, embodiments of the present invention will be described in detail with use of the embodiments and the drawings. Incidentally, the embodiments that will be described below each represent a comprehensive or specific example. Numerical values, shapes, materials, components, placement and connection modes of the components, and the like that will be designated in the following embodiments each represent an example and are not intended to limit the present invention. Among the components of the following embodiments, components not stated in the independent claims will be described as optional components. Further, sizes of components illustrated in the drawings or ratios of the sizes are not necessarily strict. In the drawings, further, substantially identical configurations are provided with identical reference characters and duplicated description may be omitted or simplified. Further, the term "connected" in the following embodiments encompasses not only direct connection but also electrical connection with another element or the like interposed therebetween.

Embodiment

Configurations of Acoustic Wave Filter

Configurations of an acoustic wave filter according to an embodiment will be described with reference to FIG. 1.

FIG. 1 is a diagram illustrating an acoustic wave filter 1 according to the embodiment and circuit configurations of a filter circuit 10 and an additional circuit 20 that are included in the acoustic wave filter 1.

The acoustic wave filter 1 is a transmitting and receiving filter from and into which high-frequency signals are outputted and inputted, for instance. For the acoustic wave filter 1, characteristics in which passage of frequencies in an intrinsic band is allowed and in which frequencies out of a pass band are attenuated are demanded.

As illustrated in FIG. 1, the acoustic wave filter 1 includes the filter circuit 10, the additional circuit 20, an input-output terminal T1, and an input-output terminal T2.

The input-output terminal T1 is a terminal from and into which high-frequency signals are outputted and inputted. The input-output terminal T1 is connected to a signal processing circuit (not illustrated) with an amplifier circuit or the like (not illustrated) interposed therebetween, for instance.

The input-output terminal T2 is a terminal from and into which high-frequency signals are outputted and inputted. The input-output terminal T2 is connected to an antenna element, for instance.

The filter circuit 10 is a filter circuit that has a first frequency band, defined by a telecommunications standard, as the pass band. The first frequency band is Band 41 (from 2496 MHz to 2690 MHz inclusive), for instance. The filter circuit 10 is provided in a first path r1 linking the input-output terminal T1 and the input-output terminal T2.

As illustrated in FIG. 1, the filter circuit 10 includes serial arm resonators S1, S2, S3, S4, S5, S6, S7 and parallel arm resonators P1, P2, P3, P4, P5, P6 that are acoustic wave resonators.

The serial arm resonators S1 to S7 are placed on the first path r1 linking the input-output terminal T1 and the input-output terminal T2. The serial arm resonators S1 to S7 are connected in series in order of mention from the input-output terminal T1 toward the input-output terminal T2.

The parallel arm resonators P1 to P6 are connected in parallel to one another on paths linking nodes between the serial arm resonators S1 to S7 and ground (reference terminals). Specifically, the parallel arm resonator P1 that is the nearest to the input-output terminal T1 of the parallel arm resonators P1 to P6 has one end connected to the node between the serial arm resonators S1 and S2 and has the other end connected to the ground. The parallel arm resonator P2 has one end connected to the node between the serial arm resonators S2 and S3 and has the other end connected to the ground. The parallel arm resonator P3 has one end connected to the node between the serial arm resonators S3 and S4 and has the other end connected to the ground. The parallel arm resonator P4 has one end connected to the node between the serial arm resonators S4 and S5 and has the other end connected to the ground. The parallel arm resonator P5 has one end connected to the node between the serial arm resonators S5 and S6 and has the other end connected to the ground. The parallel arm resonator P6 has one end connected to the node between the serial arm resonators S6 and S7 and has the other end connected to the ground.

Thus, the filter circuit 10 has a ladder filter structure made of the seven serial arm resonators S1 to S7 placed on the first path r1 and the six parallel arm resonators P1 to P6 placed on the paths linking the first path r1 and the ground.

Incidentally, numbers of the serial arm resonators and the parallel arm resonators that configure the filter circuit 10 are not limited to 7 or 6 and it is sufficient if one or more serial arm resonators and one or more parallel arm resonators exist. Further, the other ends of some parallel arm resonators among the plurality of parallel arm resonators may be commonized and connected to the ground.

The additional circuit 20 illustrated in FIG. 1 is a cancel circuit that has a cancellation component having an opposite phase and the same amplitude to and as the filter circuit 10 in order to improve attenuation characteristics of the filter circuit 10 out of the pass band.

The additional circuit 20 is provided in a second path r2 connected in parallel to at least a portion of the first path r1. The additional circuit 20 is connected to a plurality of nodes on the first path r1, for instance.

The additional circuit 20 includes an acoustic coupling resonator 25 including a plurality of interdigital transducers (IDTs) 31 and 32. The IDT 31 of the plurality of IDTs 31, 32 is connected to the first path r1 on a side of the input-output terminal T1 as seen from the acoustic coupling resonator 25, specifically, to a node n1 between the input-output terminal T1 and the serial arm resonator S1. The IDT 32 is connected to the first path r1 on a side of the input-output terminal T2 as seen from the acoustic coupling resonator 25, specifically, to a node n8 between the serial arm resonator S7 and the input-output terminal T2. In other words, the IDT 31 is connected to the first path r1 on the side of the input-output terminal T1 as seen from the serial arm resonators S1 to S7 connected in parallel to the acoustic coupling resonator 25 and the IDT 32 is connected to the first path r1 on the side of the input-output terminal T2 as seen from the serial arm resonators S1 to S7.

Configurations of Additional Circuit

Configurations of the additional circuit 20 will be described with reference to FIG. 2.

Figure 2:
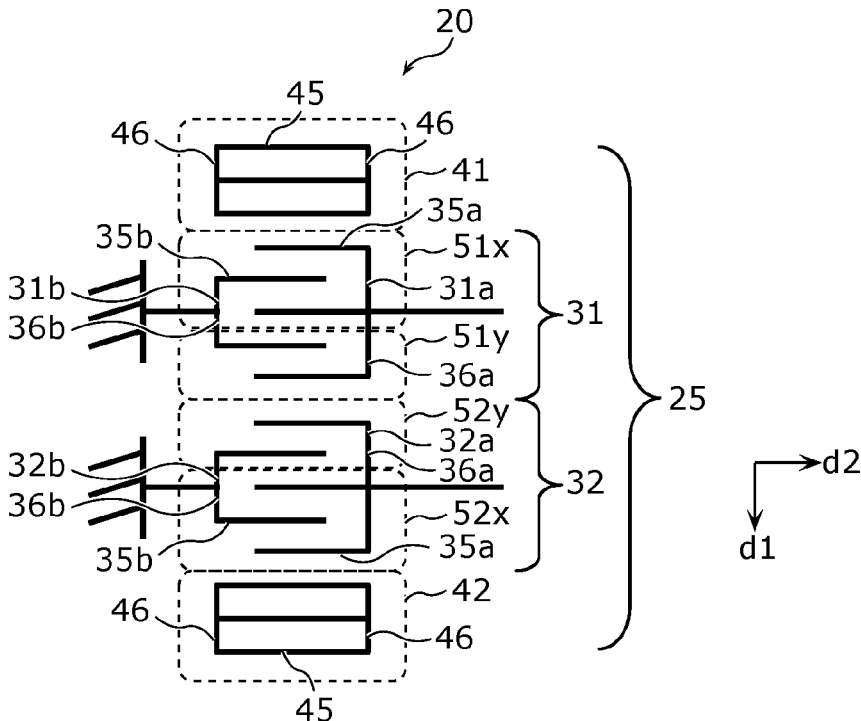
FIG. 2 is a diagram schematically illustrating an acoustic coupling resonator included in the additional circuit.

FIG. 2 is a diagram schematically illustrating the acoustic coupling resonator 25 included in the additional circuit 20.

As illustrated in FIG. 2, the acoustic coupling resonator 25 includes the plurality of IDTs 31 and 32 and a plurality of reflectors 41 and 42. The acoustic coupling resonator 25 configures a longitudinally coupled resonator.

The acoustic coupling resonator 25 is made of a surface acoustic wave (SAW) resonator, for instance. The acoustic coupling resonator 25 is formed of a piezoelectric substrate, an electrode layer configuring IDT electrodes and reflector electrodes provided on the piezoelectric substrate, and a dielectric layer that is provided on the piezoelectric substrate so as to cover the electrode layer.

The piezoelectric substrate has a structure in which SiN, $SiO_2$, and $LiTaO_3$ are stacked in order of mention on a silicon substrate. A thickness of SiN is 50 nm, a film thickness of $SiO_2$ is 400 nm, and a film thickness of $LiTaO_3$ is 300 nm, for instance. The electrode layer has a structure in which Ti, AlCu, and Ti are stacked in order of mention from a side of the piezoelectric substrate and respective thicknesses of those are 18 nm, 100 nm, and 4 nm. The dielectric layer includes $SiO_2$ and has a thickness of 30 nm.

The plurality of IDTs 31, 32 are placed along a first direction d1 parallel to a principal surface of the piezoelectric substrate. The IDT 31 includes a first comb-shaped electrode 31*a* and a second comb-shaped electrode 31*b* that form a pair. The IDT 32 includes a first comb-shaped electrode 32*a* and a second comb-shaped electrode 32*b* that form a pair.

The first comb-shaped electrodes 31*a*, 32*a* each include a busbar electrode 36*a* extending in the first direction d1 and a plurality of electrode fingers 35*a* connected to the busbar electrode 36*a* and extending in a second direction d2 orthogonal to the first direction d1. The busbar electrode 36*a* connects one ends of the plurality of electrode fingers 35*a*.

The second comb-shaped electrodes 31*b*, 32*b* each include a busbar electrode 36*b* extending in the first direction d1 and a plurality of electrode fingers 35*b* connected to the busbar electrode 36*b* and extending in the second direction d2. The busbar electrode 36*b* connects one ends of the plurality of electrode fingers 35*b*. The plurality of electrode fingers 35*a* and 35*b* are interdigitated into each other in the second direction d2 and are placed in parallel to each other.

The first comb-shaped electrodes 31*a*, 32*a* are connected to signal wiring on the second path r2 and the second comb-shaped electrodes 31*b*, 32*b* are connected to the ground. That is, the busbar electrode 36*a* and the electrode fingers 35*a* are set at a signal potential and the busbar electrode 36*b* and the electrode fingers 35*b* are set at a ground potential. Hereinbelow, both of the electrode fingers 35*a* and the electrode fingers 35*b* may be referred to and designated as electrode fingers 35.

The reflector 41 is placed adjacent to the outermost IDT 31 that is located in an outermost side portion of the plurality of IDTs 31, 32 with respect to the first direction d1. The reflector 42 is placed adjacent to the outermost IDT 32 that is located in an outermost side portion of the plurality of IDTs 31, 32 with respect to the first direction d1. That is, the plurality of reflectors 41, 42 are placed in both outer side portions out of the IDTs 31, 32 with respect to the first direction d1 so that the plurality of IDTs 31, 32 are interposed therebetween.

The reflectors 41, 42 each include a plurality of reflection electrode fingers 45 and a plurality of reflection busbars 46. The plurality of reflection electrode fingers 45 extend in the second direction d2 and are arranged along the first direction d1. The reflection busbars 46 each connect one ends or the other ends of the plurality of reflection electrode fingers 45 and are placed so as to extend in the first direction d1.

As illustrated in FIG. 2, the IDT 31 includes a first excitation portion 51*x* and a second excitation portion 51*y* and the IDT 32 includes a first excitation portion 52*x* and a second excitation portion 52*y*. The first excitation portions 51*x*, 52*x* are portions to generate the cancellation component having the opposite phase and the same amplitude to and as the filter circuit 10, as a primary purpose of the additional circuit 20. The second excitation portions 51*y*, 52*y* are narrow pitch portions to curb too strong excitation of the first excitation portions 51*x*, 52*x*.

The first excitation portion 51*x* of the IDT 31 is placed adjacent to the reflector 41 in the first direction d1. The first excitation portion 51*x* has more electrode fingers than a half of the plurality of electrode fingers 35 included in the outermost IDT 31. More specifically, provided a total number of the electrode fingers included in the outermost IDT 31 is defined as N, the first excitation portion 51*x* has the electrode fingers numbered in ((N/2)+1) on condition that N is an even number or has the electrode fingers numbered in ((N+1)/2) on condition that N is an odd number. The first excitation portion 51*x* may have the number of pairs that is 60% or more of the number of pairs included in the outermost IDT 31.

The second excitation portion 51*y* of the IDT 31 is placed on an opposite side to the reflector 41 as seen from the first excitation portion 51*x* in the first direction d1. The second excitation portion 51*y* has two or more electrode fingers, except the electrode fingers of the first excitation portion 51*x*, among the plurality of electrode fingers 35 included in the outermost IDT 31. The number of the electrode fingers 35 and the number of pairs thereof in the second excitation portion 51*y* are smaller than the respective numbers in the first excitation portion 51*x*.

The first excitation portion 52*x* of the IDT 32 is placed adjacent to the reflector 42 in the first direction d1. The first excitation portion 52*x* has more electrode fingers than a half of the plurality of electrode fingers 35 included in the outermost IDT 32. More specifically, provided a total number of the electrode fingers included in the outermost IDT 32 is defined as N, the first excitation portion 52*x* has the electrode fingers numbered in ((N/2)+1) on condition that N is an even number or has the electrode fingers numbered in ((N+1)/2) on condition that N is an odd number. The first excitation portion 52*x* may have the number of pairs that is 60% or more of the number of pairs included in the outermost IDT 32.

The second excitation portion 52*y* of the IDT 32 is placed on an opposite side to the reflector 42 as seen from the first excitation portion 52*x* in the first direction d1. The second excitation portion 52*y* has two or more electrode fingers, except the electrode fingers of the first excitation portion 52*x*, among the plurality of electrode fingers 35 included in the outermost IDT 32. The number of the electrode fingers 35 and the number of pairs thereof in the second excitation portion 52*y* are smaller than the respective numbers in the first excitation portion 52*x*.

In the present embodiment, an arrangement pitch of the electrode fingers 35 included in the first excitation portions 51*x*, 52*x* and an arrangement pitch of the reflection electrode fingers 45 included in the reflectors 41, 42 have relation that will be described below.

Specifically, provided an average arrangement pitch of the electrode fingers 35 included in the first excitation portion 51*x* of the IDT 31 in the first direction d1 is defined as px and provided an average arrangement pitch of the reflection electrode fingers 45 included in the reflector 41 in the first direction d1 is defined as pr, an arrangement pitch ratio (pr/px) that is a ratio of pr to px has a value in a range from 0.5 to 0.97 inclusive or a range from 1.15 to 2.0 inclusive.

Similarly, provided an average arrangement pitch of the electrode fingers 35 included in the first excitation portion 52*x* of the IDT 32 in the first direction d1 is defined as px and provided an average arrangement pitch of the reflection electrode fingers 45 included in the reflector 42 in the first direction d1 is defined as pr, the arrangement pitch ratio (pr/px) has a value in a range from 0.5 to 0.97 inclusive or a range from 1.15 to 2.0 inclusive.

Thus, occurrence of excitation waves in a band out of the pass band can be curbed by setting of the arrangement pitch ratio (pr/px) that is the ratio of pr to px in the range from 0.5 to 0.97 inclusive or the range from 1.15 to 2.0 inclusive. The numerical ranges will be described later.

Incidentally, provided an average arrangement pitch of the electrode fingers 35 included in the second excitation portion $51y$ in the first direction d1 is defined as py, the present embodiment has relation of px>py. That is, the second excitation portion $51y$ has a narrower pitch as a distance between the electrode fingers 35 than the first excitation portion $51x$. Further, provided an average arrangement pitch of the electrode fingers 35 included in the second excitation portion $52y$ in the first direction d1 is defined as py, the present embodiment has relation of px>py. That is, the second excitation portion $52y$ has a narrower pitch as a distance between the electrode fingers 35 than the first excitation portion $52x$.

Method of Finding Arrangement Pitch

Figure 3:
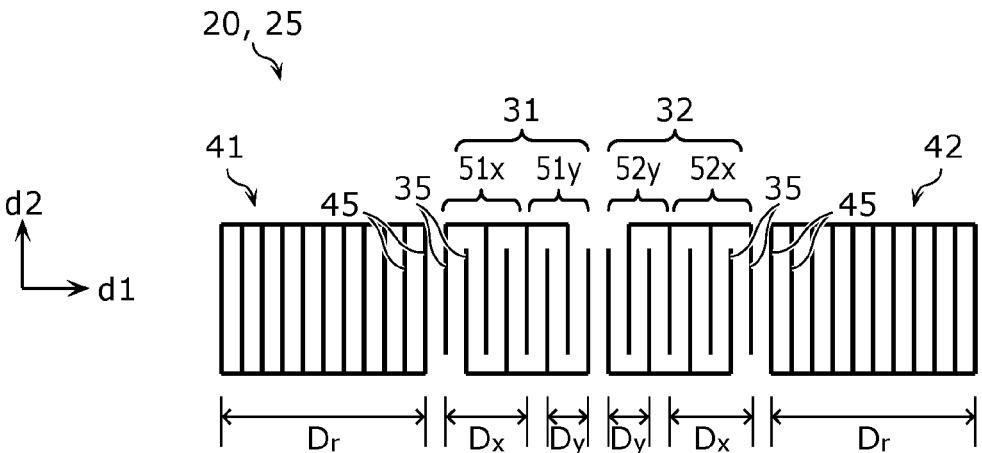
FIG. 3 is a diagram illustrating average arrangement pitches of electrode fingers of first excitation portions and second excitation portions of IDTs included in the acoustic coupling resonator and an average arrangement pitch of reflection electrode fingers of reflectors.

A method of finding the average arrangement pitches px, py and the average arrangement pitch pr will be described. FIG. 3 is a diagram illustrating the arrangement pitches of the electrode fingers 35 of the first excitation portions $51x$, $52x$ and the second excitation portions $51y$, $52y$ of the IDTs 31, 32 included in the acoustic coupling resonator 25 and the arrangement pitch of the reflection electrode fingers 45 of the reflectors 41, 42.

The arrangement pitch of the electrode fingers 35 of the first excitation portion $51x$ (or $52x$) refers to a center-to-center distance between the electrode fingers adjoining in the first direction d1 in the plurality of electrode fingers 35 included in the IDT 31 (or 32). All the arrangement pitches of the plurality of electrode fingers 35 in the first excitation portion $51x$ (or $52x$) may be identical or some or all of the arrangement pitches may be different. Hereinbelow, a distance between centers of two electrode fingers in the first direction d1 may be simply referred to as "center-to-center distance".

The average arrangement pitch px of the electrode fingers 35 of the first excitation portion $51x$ is derived as follows. A total number of the electrode fingers included in the first excitation portion $51x$ is defined as Nx, for instance. Further, the center-to-center distance between the electrode finger located at one end of the first excitation portion $51x$ in the first direction d1 and the electrode finger located at the other end thereof is defined as Dx. Then, the average arrangement pitch px can be represented by an equation $px=Dx/(Nx-1)$. Incidentally, $(Nx-1)$ may be conceived as a total number of gaps formed by adjoining electrode fingers in the first excitation portion $51x$. The average arrangement pitch px of the electrode fingers 35 of the first excitation portion $52x$ of the IDT 32 is similarly derived as well.

The arrangement pitch of the electrode fingers of the second excitation portion $51y$ (or $52y$) refers to a center-to-center distance between the electrode fingers adjoining in the first direction d1 in the plurality of electrode fingers 35 included in the IDT 31 (or 32). All the arrangement pitches of the plurality of electrode fingers 35 in the second excitation portion $51y$ (or $52y$) may be identical or some or all of the arrangement pitches may be different.

The average arrangement pitch py of the electrode fingers 35 of the second excitation portion $51y$ is derived as follows. A total number of the electrode fingers included in the second excitation portion $51y$ is defined as Ny, for instance. Further, the center-to-center distance between the electrode finger located at one end of the second excitation portion $51y$ in the first direction d1 and the electrode finger located at the other end thereof is defined as Dy. Then, the average arrangement pitch py can be represented by an equation $py=Dy/(Ny-1)$. Incidentally, $(Ny-1)$ may be conceived as a total number of gaps formed by adjoining electrode fingers in the second excitation portion $51y$. The average arrangement pitch py of the electrode fingers 35 of the second excitation portion $52y$ of the IDT 32 is similarly derived as well.

The arrangement pitches of the reflection electrode fingers 45 of the reflectors 41, 42 refer to center-to-center distances between the reflection electrode fingers adjoining in the first direction d1 in the plurality of reflection electrode fingers 45 included in the respective reflectors 42, 42. All the arrangement pitches of the plurality of reflection electrode fingers 45 in the reflectors 41, 42 may be identical or some or all of the arrangement pitches may be different.

The average arrangement pitch pr of the reflection electrode fingers 45 of the reflector 41 is derived as follows. A total number of the reflection electrode fingers 45 included in the reflector 41 is defined as Nr, for instance. Further, the center-to-center distance between the reflection electrode finger located at one end of the reflector 41 in the first direction d1 and the reflection electrode finger located at the other end thereof is defined as Dr. Then, the average arrangement pitch pr can be represented by an equation $pr=Dr/(Nr-1)$. Incidentally, $(Nr-1)$ may be conceived as a total number of gaps formed by adjoining reflection electrode fingers in the reflector 41. The average arrangement pitch pr of the reflection electrode fingers 45 of the reflector 42 is similarly derived as well.

Incidentally, as for measurement sites for the arrangement pitches, a distance between imaginary lines extending through midpoints of intersecting widths of specified adjoining electrode fingers with respect to the first direction d1 and being parallel to the second direction d2 may be substituted. In a method of measuring the arrangement pitches, measurements can be taken from length measurements based on observation by optical microscope or SEM from a top face (direction perpendicular to both of the first direction d1 and the second direction d2) or based on exposition of a section intersecting the imaginary lines by grinding or the like and observation by optical microscope or SEM.

Bandpass Characteristics of Acoustic Wave Filter

Bandpass characteristics and the like of acoustic wave filters of working examples and comparative examples will be described.

Figure 4:
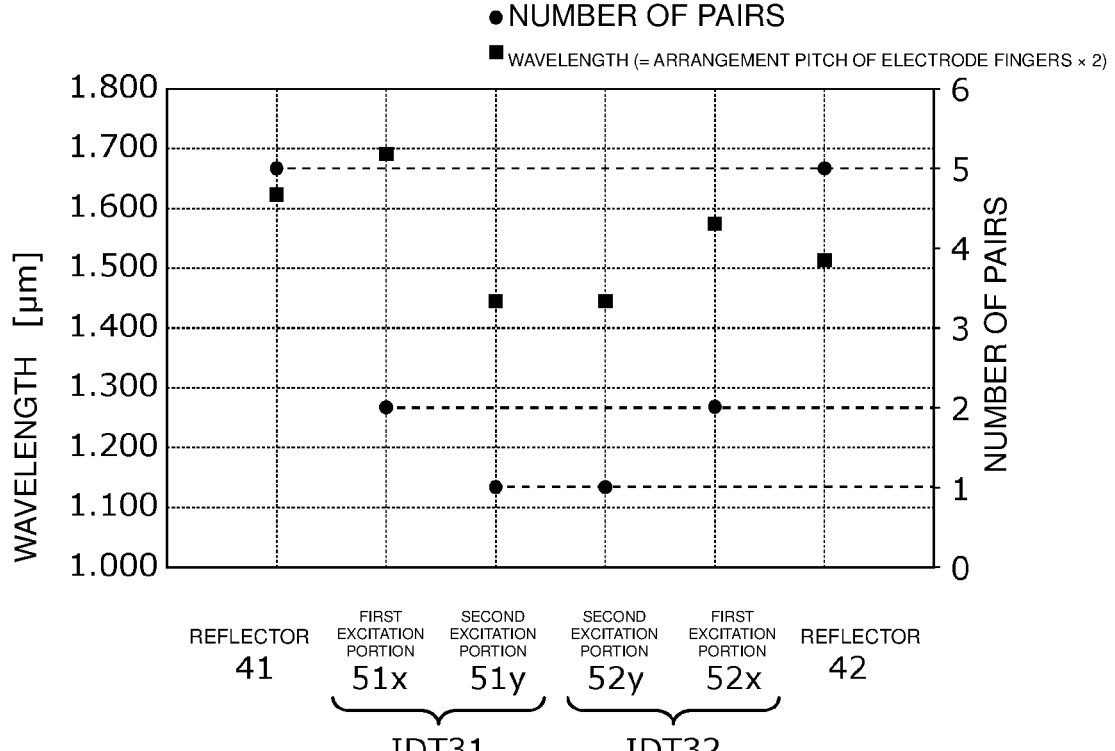
FIG. 4 is a diagram illustrating an example of the average arrangement pitches of the electrode fingers of the first excitation portions and the second excitation portions and the average arrangement pitch of the reflection electrode fingers of the reflectors.

FIG. 4 is a diagram illustrating an example of the average arrangement pitches px, py of the electrode fingers 35 of the first excitation portions $51x$, $52x$ and the second excitation portions $51y$, $52y$ and the average arrangement pitch pr of the reflection electrode fingers 45 of the reflectors 41, 42.

A vertical axis at left in FIG. 4 represents wavelengths that are double the arrangement pitches. Further, a vertical axis at right in FIG. 4 represents the numbers of pairs of the electrode fingers 35 and the reflection electrode fingers 45. Incidentally, the numbers of pairs in the reflectors 41, 42 are values obtained with two reflection electrode fingers 45 defined as a pair.

As illustrated in FIG. 4, the second excitation portion $51y$ is smaller in the average arrangement pitch px than the first excitation portion $51x$ and the second excitation portion $52y$ is smaller in the average arrangement pitch py than the first excitation portion $52x$. Incidentally, the first excitation portion and the second excitation portion are equal in duty and are equal in the intersecting width.

Further, the second excitation portion $51y$ is smaller in the number of the pairs than the first excitation portion $51x$ and the second excitation portion $52y$ is smaller in the number of the pairs than the first excitation portion $52x$. In other words, the number of the electrode fingers 35 in the first excitation portion $51x$ (or $52x$) is greater than the number of the electrode fingers 35 in the second excitation portion $51y$ (or 52$y$). Incidentally, the numbers of pairs in the first excitation portions 51$x$ and 52$x$ are equal and the numbers of pairs in the second excitation portions 51$y$ and 52$y$ are equal.

Further, the reflector 41 is greater in the number of the pairs than the first excitation portion 51$x$ and the reflector 42 is greater in the number of the pairs than the first excitation portion 52$x$. In this example, the number of the reflection electrode fingers 45 in the reflector 41 (or 42) is greater than the number of the electrode fingers 35 in the first excitation portion 51$x$ (or 52$x$). Incidentally, the numbers of the pairs in the reflectors 41 and 42 are equal.

The bandpass characteristics with change in the arrangement pitch ratio (pr/px) under conditions of electrode parameters described above will be described.

Initially, excitation waves of resonant mode M1 that occur in a band on a lower frequency side relative to the pass band will be described.

Figure 5:
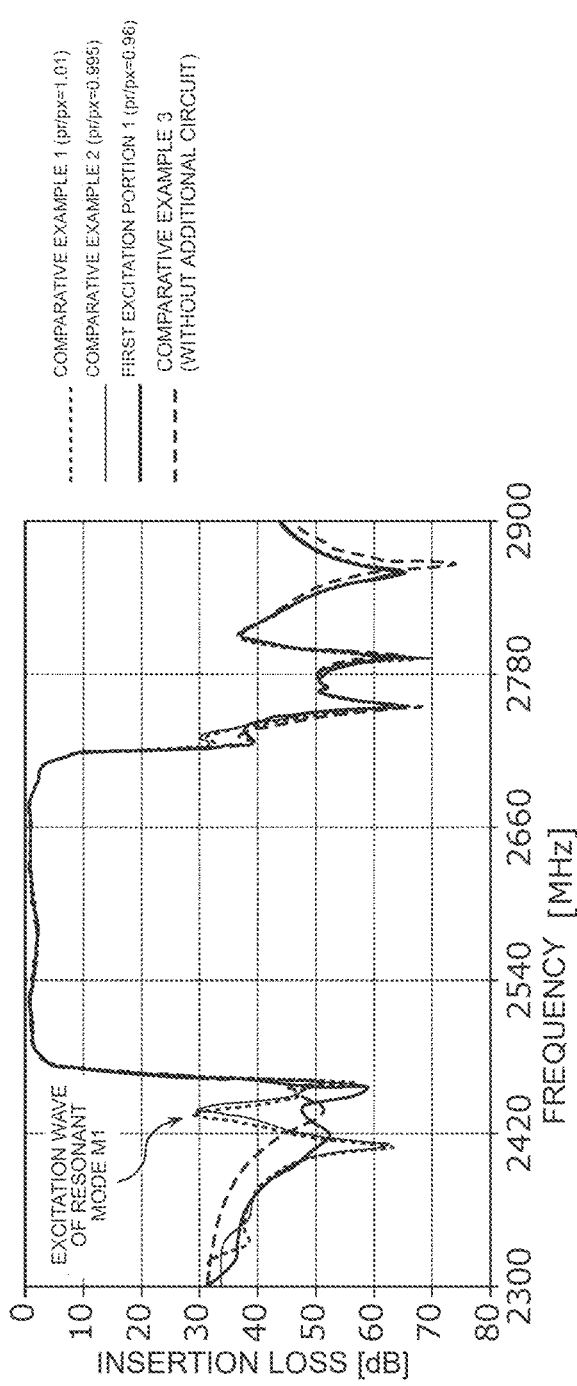
FIG. 5 is a diagram illustrating bandpass characteristics of acoustic wave filters of comparative examples 1, 2, and 3 and working example 1.

FIG. 5 is a diagram illustrating bandpass characteristics of acoustic wave filters of comparative examples 1, 2, and 3 and working example 1.

Comparative example 1 represents the bandpass characteristics with the arrangement pitch ratio (pr/px) of 1.01. Comparative example 2 represents the bandpass characteristics with the arrangement pitch ratio (pr/px) of 0.995. Comparative example 3 represents the bandpass characteristics only of a filter circuit provided with no additional circuit. Working example 1 represents the bandpass characteristics with the arrangement pitch ratio (pr/px) of 0.96.

As illustrated in FIG. 5, attenuation in frequencies from 2350 MHz to 2420 MHz can be increased in comparative examples 1 and 2 and working example 1 in which the additional circuit is connected to the filter circuit 10, compared with comparative example 3 provided with no additional circuit.

In comparative examples 1 and 2, however, excitation waves (responses) having a peak value exceeding 30 dB occur in a vicinity of 2450 MHz located on the lower frequency side relative to the pass band. The excitation waves are excitation waves of the resonant mode M1 that occur in a gap between the IDTs 31 and 32 of the acoustic coupling resonator 25.

In working example 1, in contrast to that, the excitation waves of the resonant mode M1 are curbed in a band (of 2420 MHz to 2490 MHz illustrated in FIG. 5) located on the lower frequency side relative to the pass band. According to the acoustic wave filter 1 of working example 1, attenuation can be ensured in the band located on the lower frequency side relative to the pass band.

In working example 1, further, occurrence of excitation waves can be curbed in a band (of 2720 MHz to 2740 MHz illustrated in FIG. 5) located on a higher frequency side relative to the pass band, compared with comparative examples 1 and 2. According to the acoustic wave filter 1 of working example 1, the attenuation can be ensured in the band located on the higher frequency side relative to the pass band as well.

Herein, a range of the arrangement pitch ratio (pr/px) suitable for curbing the excitation waves of the resonant mode M1 will be described.

Figure 6:
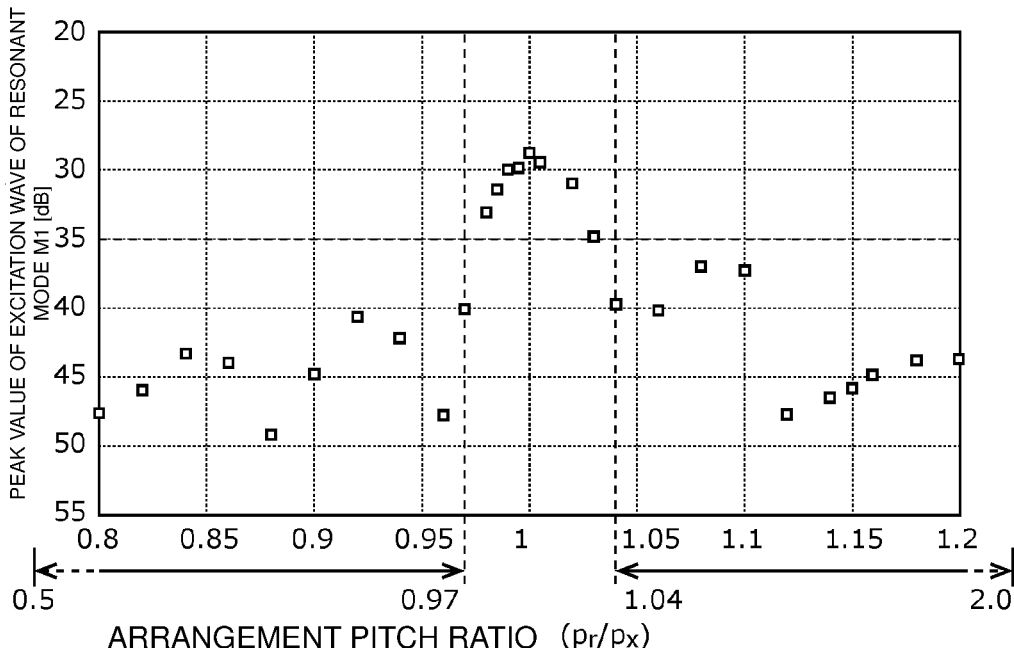
FIG. 6 is a diagram illustrating relation between arrangement pitch ratios that are ratios of the average arrangement pitch of the electrode fingers of the first excitation portions to the average arrangement pitch of the reflection electrode fingers of the reflector and amplitudes of excitation waves of a resonant mode that occur in a gap between the IDTs of the acoustic coupling resonator.

FIG. 6 is a diagram illustrating relation between arrangement pitch ratios (pr/px) that are ratios of the average arrangement pitch px of the electrode fingers 35 of the first excitation portions to the average arrangement pitch pr of the reflection electrode fingers 45 of the reflector and amplitudes of excitation waves of the resonant mode M1 that occur in a gap between the IDTs 31 and 32 of the acoustic coupling resonator 25. Incidentally, original data of a graph of FIG. 6 is as described in Table 1.

TABLE 1

| Arrangement pitch ratio (pr/px) | Peak value of excitation wave of resonant mode M1 [dB] |
|---|---|
| 0.8 | 47.6 |
| 0.82 | 45.91 |
| 0.84 | 43.24 |
| 0.86 | 43.95 |
| 0.88 | 49.16 |
| 0.9 | 44.76 |
| 0.92 | 40.62 |
| 0.94 | 42.16 |
| 0.96 | 47.81 |
| 0.97 | 39.99 |
| 0.98 | 32.98 |
| 0.985 | 31.3 |
| 0.99 | 29.83 |
| 0.995 | 29.72 |
| 1.0 | 28.65 |
| 1.005 | 29.27 |
| 1.01 | 28.77 |
| 1.02 | 30.86 |
| 1.03 | 34.73 |
| 1.04 | 39.69 |
| 1.06 | 40.12 |
| 1.08 | 36.92 |
| 1.1 | 37.21 |
| 1.12 | 47.71 |
| 1.14 | 46.45 |
| 1.15 | 45.78 |
| 1.16 | 44.8 |
| 1.18 | 43.71 |
| 1.2 | 43.63 |

A vertical axis in FIG. 6 represents peak values of the excitation waves of the resonant mode M1 that occur in the gap between the IDTs 31 and 32. A horizontal axis in the same drawing represents the arrangement pitch ratios (pr/px) described above. Incidentally, the arrangement pitch ratio (pr/px) was changed in value with px fixed and with pr changed.

As for evaluation of the excitation waves of the resonant mode M1, it was determined in this example that the occurrence of the excitation waves was curbed, provided the peak value of the excitation waves was lower than or equal to 35 dB. Though it can be determined that the attenuation has been ensured when insertion loss is lower than or equal to 30 dB, for instance, 35 dB was used as an evaluation criterion in this example because the resonant mode M1 appears in the band near the pass band of the acoustic wave filter 1.

In the acoustic wave filter 1, as illustrated in FIG. 6, the peak value of the excitation waves of the resonant mode M1 can be made lower than 35 dB on condition that the arrangement pitch (pr/px) has a value in the range from 0.5 to 0.97 inclusive or a range from 1.04 to 2.0 inclusive.

Incidentally, a lower limit of the arrangement pitch ratio (pr/px) that is greater than or equal to 0.5 and an upper limit thereof that is greater than or equal to 2.0 are set because the arrangement pitch ratio (pr/px) smaller than 0.5 or greater than 2.0 prevents coupling of the reflectors and waves having occurred in the IDTs and inhibits fulfilment of a role of the reflectors in preventing acoustic coupling with other resonators.

Subsequently, excitation waves of resonant mode M2 that occur in a band on a lower frequency side relative to the resonant mode M1 will be described.

Figure 7:
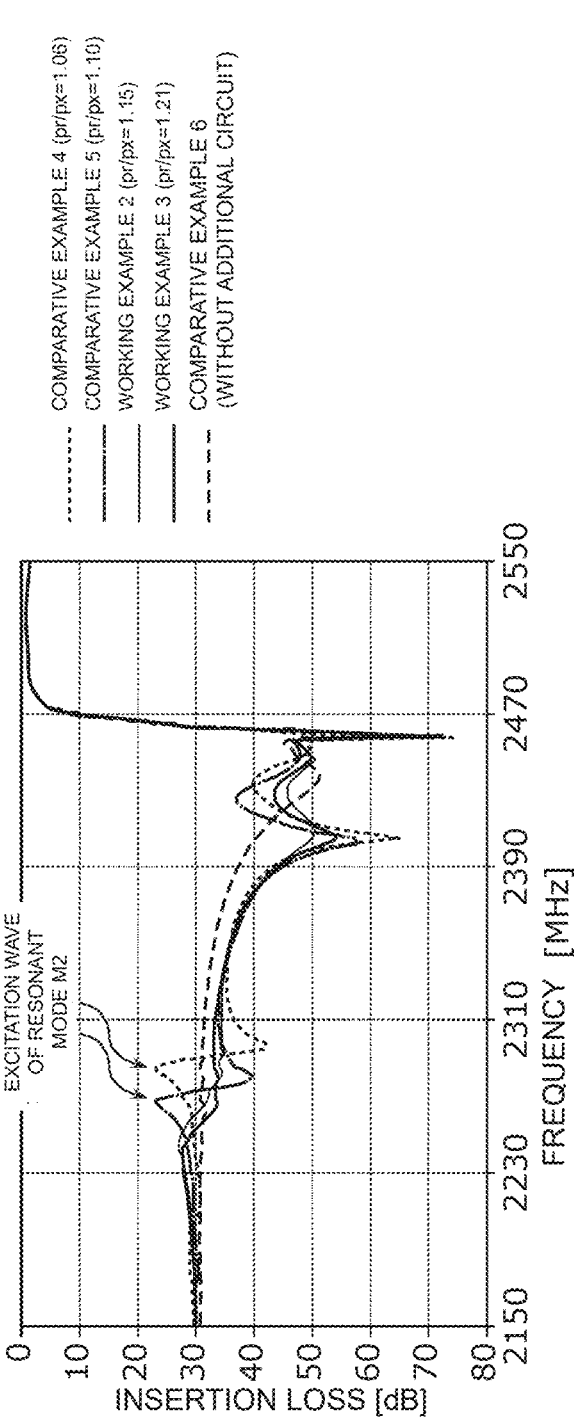
FIG. 7 is a diagram illustrating bandpass characteristics of acoustic wave filters of comparative examples 4, 5, and 6 and working examples 2 and 3.

FIG. 7 is a diagram illustrating bandpass characteristics of acoustic wave filters of comparative examples 4, 5, and 6 and working examples 2 and 3. In the drawing, bandpass characteristics in a portion of the pass band of the acoustic wave filter and on the lower frequency side relative to the pass band are illustrated.

Comparative example 4 represents the bandpass characteristics with the arrangement pitch ratio (pr/px) of 1.06. Comparative example 5 represents the bandpass characteristics with the arrangement pitch ratio (pr/px) of 1.10. Comparative example 6 represents the bandpass characteristics only of a filter circuit provided with no additional circuit. Incidentally, comparative example 6 is the same as comparative example 3 described above. Working example 2 represents the bandpass characteristics with the arrangement pitch ratio (pr/px) of 1.15. Working example 3 represents the bandpass characteristics with the arrangement pitch ratio (pr/px) of 1.21.

As illustrated in FIG. 7, attenuation in frequencies from 2310 MHz to 2390 MHz can be increased in comparative examples 4 and 5 and working examples 2 and 3 in which the additional circuit is connected to the filter circuit 10, compared with comparative example 6 provided with no additional circuit.

In comparative examples 4 and 5, however, excitation waves (responses) having a peak value exceeding 25 dB occur in a band of 2250 MHz to 2290 MHz located on the lower frequency side relative to the pass band. The excitation waves are excitation waves of the resonant mode M2 that occur due to acoustic coupling in the acoustic coupling resonator.

In working examples 2 and 3, in contrast to that, the excitation waves of the resonant mode M2 are curbed in a band (in a vicinity of 2230 MHz illustrated in FIG. 7) located on the lower frequency side relative to the pass band. According to the acoustic wave filter 1 of working examples 2 and 3, attenuation can be ensured in the band located on the lower frequency side relative to the pass band.

Herein, a range of the arrangement pitch ratio (pr/px) suitable for curbing the excitation waves of the resonant mode M2 will be described.

Figure 8:
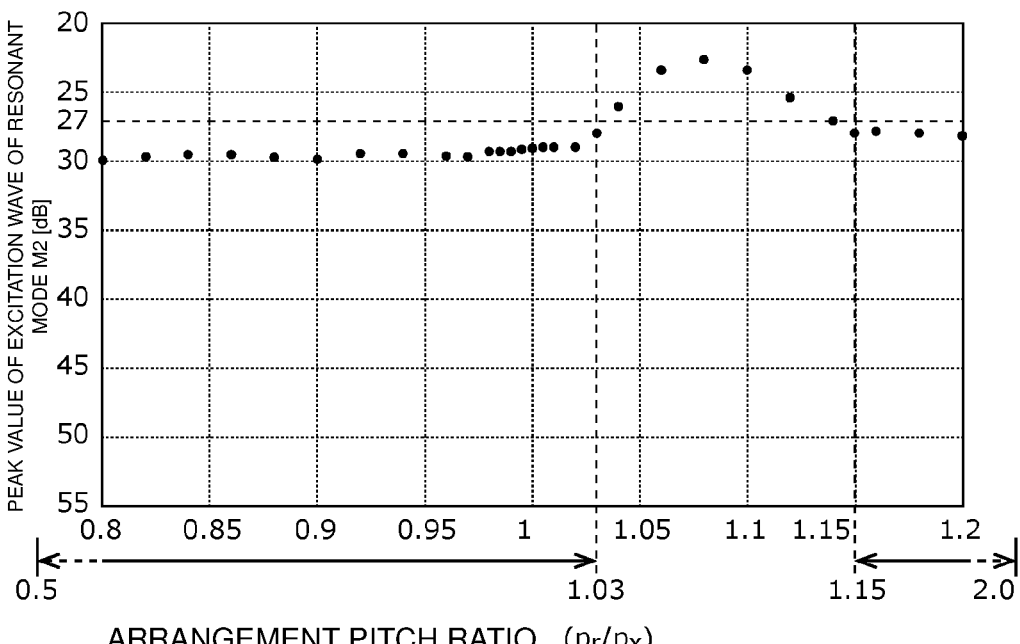
FIG. 8 is a diagram illustrating relation between the arrangement pitch ratios that are the ratios of the average arrangement pitch of the electrode fingers of the first excitation portions to the average arrangement pitch of the reflection electrode fingers of the reflectors and amplitudes of excitation waves of a resonant mode that occur due to acoustic coupling in the acoustic coupling resonator.

FIG. 8 is a diagram illustrating relation between the arrangement pitch ratios (pr/px) that are the ratios of the average arrangement pitch px of the electrode fingers 35 of the first excitation portions to the average arrangement pitch pr of the reflection electrode fingers 45 of the reflectors and amplitudes of excitation waves of the resonant mode M2 that occur due to acoustic coupling in the acoustic coupling resonator 25. Incidentally, original data of a graph of FIG. 8 is as described in Table 2.

TABLE 2

| Arrangement pitch ratio (pr/px) | Peak value of excitation wave of resonant mode M2 [dB] |
| --- | --- |
| 0.8 | 29.77 |
| 0.82 | 29.56 |
| 0.84 | 29.37 |
| 0.86 | 29.4 |
| 0.88 | 29.6 |
| 0.9 | 29.75 |
| 0.92 | 29.33 |
| 0.94 | 29.3 |
| 0.96 | 29.51 |
| 0.97 | 29.55 |
| 0.98 | 29.16 |
| 0.985 | 29.14 |
| 0.99 | 29.18 |
| 0.995 | 29.03 |
| 1.0 | 28.93 |
| 1.005 | 28.87 |

TABLE 2-continued

| Arrangement pitch ratio (pr/px) | Peak value of excitation wave of resonant mode M2 [dB] |
| --- | --- |
| 1.01 | 28.84 |
| 1.02 | 28.84 |
| 1.03 | 27.84 |
| 1.04 | 25.9 |
| 1.06 | 23.27 |
| 1.08 | 22.49 |
| 1.1 | 23.27 |
| 1.12 | 25.25 |
| 1.14 | 26.95 |
| 1.15 | 27.85 |
| 1.16 | 27.71 |
| 1.18 | 27.85 |
| 1.2 | 28.03 |

A vertical axis in FIG. 8 represents peak values of the excitation waves of the resonant mode M2 that occur due to the acoustic coupling in the acoustic coupling resonator 25. A horizontal axis in the same drawing represents the arrangement pitch ratios (pr/px) described above. Incidentally, the arrangement pitch ratio (pr/px) was changed in value with px fixed and with pr changed.

As for evaluation of the excitation waves of the resonant mode M2, it was determined in this example that the occurrence of the excitation waves was curbed, provided the peak value of the excitation waves was lower than or equal to 27 dB. The resonant mode M2 is in a distant location from the pass band and thus 27 dB was used as an evaluation criterion in this example, though it can be determined that the attenuation has been ensured when the insertion loss is lower than or equal to 25 dB, for instance.

In the acoustic wave filter 1, as illustrated in FIG. 8, the peak value of the excitation waves of the resonant mode M2 can be made lower than 27 dB on condition that the arrangement pitch (pr/px) has a value in the range from 0.5 to 1.03 inclusive or a range from 1.15 to 2.0 inclusive.

Incidentally, a lower limit of the arrangement pitch ratio (pr/px) that is greater than or equal to 0.5 and an upper limit thereof that is greater than or equal to 2.0 are set because the arrangement pitch ratio (pr/px) smaller than 0.5 or greater than 2.0 prevents coupling of the reflectors and waves having occurred in the IDTs and inhibits fulfilment of a role of the reflectors in preventing acoustic coupling with other resonators.

Based on FIGS. 6 and 8 described above, furthermore, it is conceived that the arrangement pitch ratio (pr/px) is preferably set as follows in order to curb the excitation waves of both the resonant modes M1 and M2. Specifically, the excitation waves of both the resonant modes M1 and M2 can be curbed by setting of the arrangement pitch ratio (pr/px) in the range from 0.5 to 0.97 inclusive or the range from 1.15 to 2.0 inclusive such that both the ranges in FIGS. 6 and 8 are satisfied. Thus, the occurrence of the excitation waves in the bands out of the pass band can be curbed.

Overview

The acoustic wave filter 1 according to the present embodiment can assume aspects that will be described below.

Aspect 1

The acoustic wave filter 1 according to the present embodiment includes: the plurality of input-output terminals T1, T2; the filter circuit 10 provided in the first path r1 linking the plurality of input-output terminals T1, T2; and the additional circuit 20 provided in the second path r2 connected in parallel to at least a portion of the first path r1. The additional circuit 20 includes the resonator (the acoustic coupling resonator 25, for instance) including the plurality of IDTs 31, 32 and the reflector 41. The plurality of IDTs 31, 32 are placed along the first direction d1. The IDTs 31, 32 each include the plurality of electrode fingers 35 extending in the second direction d2 intersecting with the first direction d1 and arranged along the first direction d1. The reflector 41 is placed adjacent to the outermost IDT 31 that is located in the outermost side portion of the plurality of IDTs 31, 32 with respect to the first direction d1 and includes the plurality of reflection electrode fingers 45 extending in the second direction d2 and arranged along the first direction d1. The outermost IDT 31 includes the first excitation portion 51x and the second excitation portion 51y. The first excitation portion 51x is placed adjacent to the reflector 41 in the first direction d1 and, provided the total number of the plurality of electrode fingers 35 included in the outermost IDT 31 is defined as N, has the electrode fingers numbered in ((N/2)+1) on condition that N is an even number or the electrode fingers numbered in ((N+1)/2) on condition that N is an odd number, among the electrode fingers 35 included in the pertinent IDT 31. The second excitation portion 51y is placed on the opposite side to the reflector 41 as seen from the first excitation portion 51x in the first direction d1 and includes two or more electrode fingers, except the electrode fingers of the first excitation portion 51x, among the plurality of electrode fingers 35 included in the outermost IDT 31. Provided the average arrangement pitch of the electrode fingers included in the first excitation portion 51x in the first direction d1 is defined as px and provided the average arrangement pitch of the plurality of reflection electrode fingers 45 in the first direction d1 is defined as pr, pr/px has a value in the range from 0.5 to 0.97 inclusive or the range from 1.15 to 2.0 inclusive.

Thus, the occurrence of the excitation waves of the resonant modes M1, M2 in the bands out of the pass band of the acoustic wave filter 1 can be curbed by setting of pr/px that is the ratio of the average arrangement pitches in the range from 0.5 to 0.97 inclusive or the range from 1.15 to 2.0 inclusive. As a result, the attenuation characteristics in the bands out of the pass band can be ensured.

Incidentally, the same thing can be said of aspect 1 with replacement of the reflector 41 by the reflector 42, replacement of the outermost IDT 31 by the outermost IDT 32, replacement of the first excitation portion 51x by the first excitation portion 52x, and replacement of the second excitation portion 51y by the second excitation portion 52y.

Aspect 2

In the acoustic wave filter 1 described as aspect 1, provided an average arrangement pitch of the electrode fingers included in the second excitation portion 51y in the first direction d1 is defined as py, px>py may hold.

By this configuration, the arrangement pitch of the electrode fingers 35 of the second excitation portion 51y can be made narrower than the 35 arrangement pitch of the electrode fingers of the first excitation portion 51x and the occurrence of the excitation waves of the resonant mode M1 can be curbed. As a result, the attenuation characteristics in the bands out of the pass band can be ensured.

Aspect 3

In the acoustic wave filter 1 described as aspect 1 or 2, the additional circuit 20 may include the plurality of reflectors 41, 42, and the plurality of reflectors 41, 42 may be placed in both outer side portions out of the plurality of IDTs 31, 32 with respect to the first direction d1.

By this configuration, Q-value can be improved by inclusion of the plurality of reflectors 41, 42. Further, even if the plurality of reflectors 41, 42 are used, the occurrence of the excitation waves of the resonant modes M1, M2 can be curbed by setting of pr/px at a value in the range described above. As a result, the attenuation characteristics in the bands out of the pass band can be ensured.

Aspect 4

In the acoustic wave filter 1 described as any one of aspects 1 to 3, a pass band of the filter circuit 10 may include a frequency band from 2496 MHz to 2690 MHz inclusive.

By this configuration, the occurrence of the excitation waves of the resonant modes M1, M2 in bands out of a range of the frequency band can be curbed. As a result, the attenuation characteristics in the bands out of the pass band can be ensured.

OTHER EMBODIMENTS

Though the acoustic wave filter according to the embodiment of the present invention has been described above with citation of the embodiment, other embodiments that are implemented with combination of desired components of the above embodiment, modifications obtained with various modifications to the embodiment that are conceived by those skilled in the art without departing from the purport of the present invention, and multiplexers, high-frequency front-end circuits, and communication devices including the acoustic wave filter according to the present invention are also encompassed by the present invention.

Though the examples in which the acoustic coupling resonator 25 includes the two IDTs 31, 32 have been described above, there is no limitation thereto and the acoustic coupling resonator 25 may include three or more IDTs. Even if the acoustic coupling resonator 25 includes three or more IDTs, the IDTs 31, 32 become the outermost IDTs and the arrangement pitch ratio (pr/px) has a value in similar ranges.

Though the examples in which the IDTs 31, 32 are directly connected to the nodes n1, n8 on the first path r1 have been described above, there is no limitation thereto and the IDTs 31, 32 may be connected to the nodes n1, n8 with capacitance elements interposed therebetween.

Though the examples in which the acoustic wave filter 1 is a transmitting and receiving filter have been described above, there is no limitation thereto and the acoustic wave filter 1 may be a transmitting filter or a receiving filter.

Further, the input-output terminals T1 and T2 each may be either an input terminal or an output terminal. For instance, the input-output terminal T2 becomes an output terminal in case where the input-output terminal T1 is an input terminal or the input-output terminal T1 becomes an output terminal in case where the input-output terminal T2 is an input terminal.

Further, the IDT electrodes do not have to have the stacked structure. The IDT electrodes may be made of metals such as Ti, Al, Cu, Pt, Au, Ag, or Pd or alloy, for instance, and may be made of a plurality of multilayer bodies made of the metals or the alloy.

Further, though the substrate having piezoelectricity has been described as a substrate in the embodiment, the substrate may be a piezoelectric substrate made of a single layer of a piezoelectric layer. The piezoelectric substrate in this configuration is made of piezoelectric single crystal of LiTaO$_3$ or another piezoelectric single crystal of LiNbO$_3$ or the like, for instance. Further, a structure in which a piezo-electric layer is stacked on a support substrate, instead of a substrate made of a piezoelectric layer as a whole, may be used as the substrate on which the IDT electrodes are formed, as long as piezoelectricity is provided therefor. Further, there is no limitation to a cut-angle of the substrate according to the embodiment. That is, the stacked structure, material, and thicknesses may be appropriately modified in accordance with required bandpass characteristics or the like of the acoustic wave filter and similar effects can be fulfilled even by a surface acoustic wave filter with use of a LiTaO$_3$ piezoelectric substrate, a LiNbO$_3$ piezoelectric substrate, or the like that has a cut-angle other than the cut-angle specified in the embodiment.

Incidentally, the additional circuit 20 may include a transversal type acoustic wave resonator instead of an acoustic coupling type acoustic wave resonator.

The present invention can be broadly utilized as a multiplexer, a front-end circuit, and a communication device including the acoustic wave filter for communications equipment such as cellular phone.

What is claimed is:

1. An acoustic wave filter comprising:
a plurality of input-output terminals;
a filter circuit in a first path linking the plurality of input-output terminals; and
an additional circuit in a second path connected in parallel to at least a portion of the first path; wherein
the additional circuit includes a resonator including a plurality of interdigital transducers (IDTs) and a reflector;
the plurality of IDTs are arranged along a first direction;
the IDTs each include a plurality of electrode fingers extending in a second direction intersecting with the first direction and arranged along the first direction;
the reflector is adjacent to an outermost IDT that is located in an outermost side portion of the plurality of IDTs with respect to the first direction and includes a plurality of reflection electrode fingers extending in the second direction and arranged along the first direction;
the outermost IDT includes a first excitation portion and a second excitation portion;
the first excitation portion is adjacent to the reflector in the first direction;
the outermost IDT includes ((N/2)+1) electrode fingers when a total number N of the electrode fingers included in the outermost IDT is an even number, or the outermost IDT includes ((N+1)/2) electrode fingers when the total number N is an odd number;
the second excitation portion is on an opposite side to the reflector as seen from the first excitation portion in the first direction and includes two or more electrode fingers, except the electrode fingers of the first excitation portion, among the plurality of electrode fingers included in the outermost IDT; and
assuming an average arrangement pitch of the electrode fingers included in the first excitation portion in the first direction is px and an average arrangement pitch of the plurality of reflection electrode fingers in the first direction is pr, pr/px has a value in a range from about 0.5 to about 0.97 or a range from about 1.15 to about 2.0.

2. The acoustic wave filter according to claim 1, wherein, assuming an average arrangement pitch of the electrode fingers included in the second excitation portion in the first direction is defined as py, px>py is satisfied.

3. The acoustic wave filter according to claim 1, wherein the additional circuit includes a plurality of reflectors at outer side portions of the plurality of IDTs with respect to the first direction.

4. The acoustic wave filter according to claim 1, wherein a pass band of the filter circuit includes a frequency band from about 2496 MHz to about 2690 MHz.

5. The acoustic wave filter according to claim 1, wherein the filter circuit has a ladder filter structure.

6. The acoustic wave filter according to claim 1, wherein the filter circuit includes a plurality of serial arm resonators on the first path and a plurality of parallel arm resonators on paths linking the first path and a ground.

7. The acoustic wave filter according to claim 1, wherein the resonator included in the additional circuit is an acoustic coupling resonator.

8. The acoustic wave filter according to claim 7, wherein the acoustic coupling resonator includes two IDTs.

9. The acoustic wave filter according to claim 7, wherein the acoustic coupling resonator includes three or more IDTs.

10. The acoustic wave filter according to claim 1, wherein the resonator included in the additional circuit is a surface acoustic wave resonator.

11. The acoustic wave filter according to claim 1, wherein the resonator included in the additional circuit includes a piezoelectric substrate on which the plurality of IDTs and the reflector are provided.

12. The acoustic wave filter according to claim 11, wherein the piezoelectric substrate includes SIN, SiO$_2$, and LiTaO$_3$ stacked in order on a silicon substrate.

13. The acoustic wave filter according to claim 1, wherein the second excitation portion is structured to reduce excitation of the first excitation portion.

14. The acoustic wave filter according to claim 1, wherein arrangement pitches of the plurality of reflection electrode fingers in the first direction are identical.

15. The acoustic wave filter according to claim 1, wherein at least some of arrangement pitches of the plurality of reflection electrode fingers in the first direction are different.

16. The acoustic wave filter according to claim 1, wherein the first excitation portion and the second excitation portion are equal in duty and are equal in an intersecting width.

17. The acoustic wave filter according to claim 1, wherein the resonator included in the additional circuit includes a dielectric layer on the plurality of IDTs and the reflector.

18. The acoustic wave filter according to claim 1, wherein the first excitation portion is structured to generate a cancellation component having an opposite phase to and a same amplitude as those of the filter circuit.

19. The acoustic wave filter according to claim 1, wherein the acoustic wave filter is a transmitting and receiving filter.

20. The acoustic wave filter according to claim 1, wherein the acoustic wave filter is a transmitting filter or a receiving filter.

* * * * *